United States Patent [19]

Arendt et al.

[11] 4,234,436
[45] Nov. 18, 1980

[54] MOLTEN SALT SYNTHESIS OF MODIFIED ALKALI NIOBATE POWDERS

[75] Inventors: Ronald H. Arendt; Joseph H. Rosolowski, both of Schenectady, N.Y.

[73] Assignee: General Electric Company, Schenectady, N.Y.

[21] Appl. No.: 85,912

[22] Filed: Oct. 18, 1979

[51] Int. Cl.$^3$ .................. C04B 35/00; C01G 23/00
[52] U.S. Cl. .................. 252/62.9; 423/593; 423/DIG. 12
[58] Field of Search .............. 423/593, DIG. 12; 252/62.9

[56] References Cited

U.S. PATENT DOCUMENTS

| | | | |
|---|---|---|---|
| 2,853,392 | 9/1958 | Bousky | 423/593 |
| 3,793,443 | 2/1974 | Arendt | 423/594 |
| 4,041,143 | 8/1977 | Fujiki et al. | 423/598 |

OTHER PUBLICATIONS

Yanagida et al., "J. Ceramic Soc., Japan", vol. 75, 1967, pp. 349-357.
Gronlt et al., "J. of Solid State Chemistry", vol. 19, Nov. 1976, pp. 235-244.

*Primary Examiner*—Herbert T. Carter
*Attorney, Agent, or Firm*—Jane M. Binkowski; James C. Davis, Jr.; Leo I. MaLossi

[57] ABSTRACT

A mixture of niobium pentoxide, an oxide of sodium or potassium, an oxide of lead or cadmium, and an alkali chloride salt solvent is heated to melt the chloride salt solvent in which all of the oxides dissolve and react precipitating modified alkali niobate.

8 Claims, No Drawings

MOLTEN SALT SYNTHESIS OF MODIFIED ALKALI NIOBATE POWDERS

The present invention relates to the preparation of small crystallite size, stoichiometric modified alkali niobate powder.

Conventionally, modified alkali niobate powder is prepared by the high temperature solid state reaction of appropriate precursor compounds. The reaction product is in the form of relatively large, strong self-bonded particle aggregrates which must be comminuted to the desired approximately 1.0 micron particle size before fabrication into ceramic articles.

One of the inadequacies of this conventional procedure is that the product, in commercial practice, is not fully reacted to yield uniform composition on a microscopic level. In cases where the physicochemical properties depend on the composition and its uniformity, the nonuniform composition of the conventional product usually leads to less than optimum properties. Although procedures can be adopted in the conventional process to minimize these variations, the penalty in additional effort generally is considerable.

The comminution portion of the conventional process is also potentially detrimental in that significant, uncontrollable quantities of undesirable impurities can be introduced from the grinding media. Again, extraordinary precautions can be taken to minimize the comminution effects, but with attendant penalties.

The present invention circumvents the inadequacies of the conventional process by substituting for the solid state reaction, a liquid phase reaction scheme utilizing a molten salt solvent with subsequent precipitation of the product which does not require comminution. In the present process, the reactants are slightly soluble in the molten salt solvent, therefore allowing literally atomic mixing in the liquid phase of the reactants. The solubilities of the reactants are such that they exceed the corresponding solubility of the alkali niobate in the molten salt solvent. Hence, the reaction product precipitates spontaneously from the molten salt solution. The reactants will continually dissolve to maintain a reactant-saturated solution until they are totally consumed by product formation.

Preferably, the reaction temperature in the present process is that required to attain reasonable reaction rates in the molten salt solvent, but it can be significantly lower than in the corresponding conventional solid state synthesis. Similarly, the reaction time can be as short as about 30 minutes or shorter compared with several hours for solid state reaction.

The present process allows the composition of the modified alkali niobate powder to be predetermined and controlled. Since the present modified alkali niobate grains are produced by precipitation, they are chemically homogeneous, i.e. they are of uniform composition on a microscopic level. Also, since the individual modified alkali niobate grains range up to about 1 micron in size and are generally submicron, they do not require any crushing or grinding operations with their attendant contamination with impurities from the equipment employed before they can be fabricated into useful ceramic articles.

Briefly stated, the present invention is a process for producing a modified alkali niobate having the formula $(A_{2x}B_{1-x})Nb_2O_6$ wherein A is an alkali atom selected from the group consisting of Na, K and mixtures thereof, B is a cation selected from the group consisting of Pb, Cd and mixtures thereof, and x has a value ranging from an effective amount up to but less than 1. The present process comprises providing in stoichiometric amount an alkali oxide selected from the group consisting of $Na_2O$, $K_2O$ and mixtures thereof or particulate precursor therefor, providing in stoichiometric amount cation oxide selected from the group consisting of PbO, CdO and mixtures thereof or particulate precursor therefor, providing in stoichiometric amount particulate $Nb_2O_5$ or particulate precursor therefor, providing an alkali chloride salt selected from the group consisting of sodium chloride, potassium chloride and mixtures thereof, forming a mixture of said alkali oxide or precursor therefor, said cation oxide or precursor therefor, said $Nb_2O_5$ or precursor therefor and said chloride salt solvent, said chloride salt being used in an amount of at least about 20% by weight of the total amount of said alkali oxide, cation oxide, $Nb_2O_5$ and said chloride salt, heating said mixture to a reaction temperature at least sufficient to melt said chloride salt, each said precursor decomposing completely at or below said reaction temperature to form said oxide and by-product gas, said chloride salt in molten form being a solvent for said alkali oxide, cation oxide and $Nb_2O_5$, maintaining said reaction temperature dissolving and reacting said alkali oxide cation oxide and $Nb_2O_5$ in said molten salt and precipitating said modified alkali niobate, and recovering said precipitated modified alkali niobate by dissolving said chloride salt and separating said precipitated modified alkali niobate from the resulting salt solution.

The reaction for producing the present modified alkali niobate is as follows:

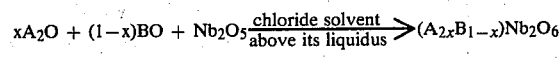

$$xA_2O + (1-x)BO + Nb_2O_5 \xrightarrow[\text{above its liquidus}]{\text{chloride solvent}} (A_{2x}B_{1-x})Nb_2O_6$$

$A_2O$ is an alkali oxide selected from the group consisting of $Na_2O$, $K_2O$ and mixtures thereof. B is a cation oxide selected from the group consisting of PbO, CdO and mixtures thereof, x has a value ranging from a small but effective amount, generally about 0.001, up to but less than 1. All of the reactants are used in stoichiometric amounts to achieve complete reaction.

The present process allows the reactant oxides to be formulated to produce a modified alkali niobate of predetermined stoichiometry. Specifically, the cationic component of the cation oxide, i.e. Pb, Cd or mixtures thereof, is substituted for a portion of the alkali atom in the alkali niobate lattice to modify the properties thereof. The particular cation oxide used and the amount thereof depends on the properties its cationic component imparts to the specific modified alkali niobate powder being formulated. The present cationic modifier can be incorporated into the alkali niobate in an amount up to the limit of its solid solubility therein. The substituted cationic component imparts significantly improved electric or piezoelectric properties to the ceramic formed from the modified powder.

The present process produces modified alkali niobate of stoichiometric composition. Since the present crystals of modified alkali niobate are produced by precipitation from a saturated solution, they are chemically homogeneous, i.e. they are of uniform composition on a microscopic level. Also, since the individual crystals range up to about 1 micron in size and are generally submicron, they do not require any crushing or grinding operations with their attendant contamination with impurities from the equipment employed before they can be fabricated into useful ceramic articles.

In carrying out the present process, the reactants or precursors therefor can be of commercial or technical grade, and their particular purity depends largely on the particular application of the resulting alkali niobate powder. Specifically, the reactant oxides should not contain any impurities which would have a significantly deleterious effect on the resulting alkali niobate powder or on its particular application.

The reactant oxides or precursors therefor should be of a size which allows the reaction to take place. Generally, these reactants or precursors therefor are used and are satisfactory in the particle size range in which they are available commercially, which ordinarily ranges from submicron up to about 100 microns. The reactant powders should also be free of large, hard aggregates, i.e. significantly about 100 microns in size, which might survive the mixing process and prevent sufficient reactant contact for satisfactory reaction rates.

In the present process the chloride salt is selected from the group consisting of sodium chloride, potassium chloride and mixtures thereof. The chloride salt solvent is used in a minimum amount of at least about 20% by weight of the total amount of reactant oxides and chloride salt solvent, and typically about 50% by weight. Amounts of chloride salt lower than about 20% by weight are not practical since the desired reaction will not proceed. There is no upper critical maximum amount of chloride salt, but amounts of chloride salt higher than about 80% by weight of the total amount of reactant oxides and chloride salt solvent provide no significant advantage. As the amount of chloride salt or salt mixture is increased from 20% by weight, to about 50% by weight, the amount of individual grains or crystals present in the resulting alkali niobate powder increases correspondingly, and with an amount of chloride salt or salt mixture above about 50% by weight, substantially all or all of the alkali niobate powder recovered consists essentially of individual grains or crystallites.

The reactants or precursors therefor and the alkali chloride salt solvent are admixed to produce a substantially thorough mixture to insure good contact and complete reaction. The actual mixing operation can be carried out in several ways which do not introduce undesirable impurities into the resulting product. Preferably, water at room or ambient temperature is admixed with the reactant oxides or precursors therefor and the chloride salt solvent in an amount which, with stirring, is at least sufficient to form a slurry. The wet mixing can be carried out, for example, using a plastic milling medium or by wet mixing in a high speed blendor with preferably distilled or deionized water, depending on the application of the resulting product and preferably, with stainless steel or plastic stirrers, for example a propeller, in a stainless steel or plastic, preferably Teflon, lined vessel.

The particular reaction temperature used depends largely on the chloride salt used and the reaction rate desired, i.e. rate of precipitation of alkali niobate desired. Generally, the higher the reaction temperature, the faster is the reaction rate. In molten form, the present chloride salt is a solvent for the reactant oxides, and the minimum reaction temperature is the temperature at which the chloride salt or salt mixture melts and for sodium chloride alone the melting point or liquidus temperature is about 1073 K (800° C.) whereas for potassium chloride alone it is about 1063 K (790° C.). All mixtures of sodium chloride and potassium chloride form a mixture which melts at a temperature below the melting point of sodium chloride alone and thus, for the eutectic mixture of 50 mole % potassium chloride −50 mole % sodium chloride the minimum reaction temperature is 931 K(658° C.). Preferably, in the present invention, the minimum reaction temperature is at least about 10 K above the melting point, i.e. liquidus temperature of the chloride salt or salt mixture since such a temperature insures complete melting of chloride salt and also increases the fluidity of the molten salt producing increased wetting of the reaction mixture. However, the maximum reaction temperature is always below the melting point of the alkali niobate being precipitated. Particularly preferred is a reaction temperature ranging from about 1073 K(800° C.) to about 1373 K(1100° C.) since it is not difficult to maintain and provides high reaction rates without significant vaporization of the molten salt solvent.

At reaction temperature the chloride salt melts and the reactant oxides dissolve and react in the molten salt precipitating the modified alkali niobate. The reaction temperature is maintained until the reaction is completed. The particular period of reaction time depends largely on reaction temperature as well as the amount of chloride salt used and is determinable empirically. When the reaction is completed, the reacted mass is cooled at any convenient rate, preferably in air and preferably to about room temperature.

The cooled modified alkali niobate-containing reacted mass is a solid, fired cake comprised of modified alkali niobate particles distributed throughout a matrix of solidified chloride salt. Specifically, the modified alkali niobate, which is maintained as distinct second phase crystallites, are present as fine crystallites embedded in the molten salt matrix. After reaction at elevated temperature, the cooled, solidified cake is disintegrated with water to yield the modified alkali niobate crystallites and an aqueous solution of the chloride salt. More specifically, water, preferably distilled or deionzed to prevent introduction of impurities and preferably at room temperature, is added to the solid reacted mass in an amount at least sufficient to dissolve away the chloride salt content therefrom. The solubility of the present chloride salt is about 0.3 kilogram per liter of water at room temperature. This dissolution preferably is carried out in a plastic vessel, and as a practical matter with mixing to substantially shorten dissolution time, using, for example, a motor driven plastic or stainless steel stirrer. As the chloride salt dissolves, the solid mass disintegrates leaving a fine alkali niobate powder that contains no perceptibly agglomerated material, i.e. perceptible to the eye. The phase pure alkali niobate powder is then collected, washed and dried.

The modified alkali powder can be recovered from the aqueous supernatant chloride solution by a number of techniques. For example, the modified alkali niobate powder can be recovered by decanting the supernatant solution and drying the modified alkali niobate in air. The particular recovery technique depends on the impurities which may be present and on the purity required in the ceramic or other product fabricated from the powder. Preferably, the resulting slurry is mixed at room temperature in air for about 20 minutes. Mixing is then discontinued and a flocculating agent which is organic and soluble in water, preferably an anionic flocculant, is added in an amount which is sufficient to flocculate and settle the modified alkali niobate powder. After several washings and settlings, the wet powder is dried. Preferably, the flocculating agent is added in aqueous solution, about 0.1 gram of flocculant per 100 grams of water usually being satisfactory, and preferably the flocculating agent is used only in an amount necessary to settle the powder. For production of a modified alkali niobate powder of high purity, the flocculating agent should be completely removable by heating the powder in air at temperatures below the melting point of the powder and preferably not higher than about 1073 K(800° C.). Preferably, to remove any remaining water and flocculant, it is heated at about 773 K(500° C.) for about 20 minutes.

Alternatively, in the present process, if desired, a particulate inorganic precursor of the reactant oxides can be used. The precursor should decompose completely to form the oxide and by-product gas or gases leaving no contaminants in the reacted mass. Representatives of the precursors of the reactant oxides useful in the present process are the carbonates, hydroxides and nitrates. The precursor should be used in an amount sufficient to produce the respective oxide in stoichiometric amount.

The present modified alkali niobate powders are lemon yellow in color. The modified alkali niobate powders are free-flowing and can be in the form of aggregates or in the form of the individual powder crystals, but usually it is a mixture of both. The aggregrates which range in size from about 1 micron to about 20 microns, are particles consisting essentially of a cluster of smaller sized crystals weakly bonded together autogeneously, i.e. such bonding is believed to be caused by Van der Waal's forces or by self-bonding, i.e. neck growth between grains. The individual crystals range up to about 1 micron in size and usually are submicron. The aggregates are friable and readily are broken down with very gentle comminution during subsequent pressing into a green body.

The present modified alkali niobate powder can be prepared free of impurities or free of significant impurities. Therefore, when the same procedure is used, its properties are reproducible from batch to batch.

The invention is further illustrated by the following example:

EXAMPLE 1

In this example, the reactants were formulated to produce a lead modified sodium niobate of the formula $Na_{1.50}Pb_{.25}Nb_2O_6$.

151.59 grams of reagent grade PbO, ranging in size up to about 100 microns, 725.76 grams of $Nb_2O_5$ ranging in size up to about 100 microns and 99.5% pure, 252.65 grams of reagent grade $Na_2CO_3.H_2O$ ranging in size up to about 100 microns, 454.9 grams of NaCl and 454.9 grams of KCl were stirred vigorously with about two liters of distilled water forming a slurry which was then dried in an air oven at ~200° C. to remove the water.

The dried mixture was placed in an alumina vessel and covered loosely with an alumina cover to prevent introduction of impurities and placed in an air furnace at room temperature and heated at a rate of about 100° C. per hour to the reaction temperature of 1273 K(1000° C.). After about 60 minutes at 1273 K(1000° C.), the power was shut off and the alumina vessel was furnace-cooled to room temperature.

The reacted product was brick-like in texture and hardness. It was placed in about 4.2 liters of distilled water in a plastic vessel provided with a motor driven plastic coated stainless steel stirrer. After about 10 minutes of stirring, the brick-like cake product disintegrated completely producing a slurry of a fine powder that contained no visually perceptible aggregated material.

An aqueous flocculating solution comprised of 0.02 gram of anionic flocculant (a polyamide imide powder sold under the trademark Hercofloc 821) in 20 grams of distilled water was then added to the stirred slurry. The powder was allowed to settle and the supernatant was then decanted.

The resulting sodium lead niobate powder was then washed with distilled water, flocculated with the aqueous flocculating solution and the supernatant decanted, and this step was done ten times. The resulting wet powder was dried by heating in air at 423 K(150° C.). The dried sodium lead niobate powder was then heated in air at about 773 K(500° C.) for about 3 hours to remove any remaining water and flocculant.

About 1000 grams of the sodium lead niobate powder were recovered. The powder was lemon yellow in color, free-flowing and did not have any perceptible aggregates, i.e. perceptible to the eye.

EXAMPLE 2

The sodium lead niobate powder prepared in Example 1 was used in this example. About 4 grams of the sodium lead niobate powder was pressed in a one inch diameter Carboloy lined steel die at 10,000 psi. The resulting pellet was embedded in sodium lead niobate powder in a crucible of stabilized zirconia which was covered with a platinum cover. The pellet was then sintered at 1260° C. to 1290° C. in an atmosphere of oxygen for one hour. The resulting sintered polycrystalline pellet of sodium lead niobate had a density of 4.7 g/cc.

Two silver electrodes were fired onto the sintered pellet, and the pellet was poled by applying a field of 80 volts per mil at 60° C. for a period of ½ hour. This resulted in the sintered pellet developing a piezoelectric strain coefficient, $d_{33}$, of $56 \times 10^{-12}$ coulombs per newton and a planar coupling coefficient of about 0.16, both properties being measured one day after poling. After poling, the loss tangent was about 0.01 and the relative dielectric constant was about 160.

These properties characterize the usefulness of the material of this sintered pellet for applications for making piezoelectric transducers.

The following copending U.S. patent applications are assigned to the assignee hereof and are incorporated herein by reference:

Ser. No. 8734 filed Feb. 2, 1979 in the names of R. H. Arendt and M. J. Curran entitled "Molten Salt Synthesis of Lithium Meta-Aluminate Powder" discloses a process consisting essentially of forming a mixture of an alkali chloride solvent salt, a lithium salt reactant selected from the group consisting of lithium hydroxide, lithium nitrate, lithium carbonate and mixtures thereof, and an aluminum salt reactant selected from the group consisting of aluminum hydroxide, alpha-alumina, gamma alumina and mixtures thereof and heating said mixture to melt the chloride salt solvent in which the lithium and aluminum salt reactants dissolve and react precipitating lithium metaaluminate.

Ser. No. 10,747 filed Feb. 9, 1979 in the names of R. H. Arendt and M. J. Curran entitled "Magnesium Aluminum Spinel" discloses a process consisting essentially of forming a mixture of magnesium oxide, aluminum oxide and an alkali chloride salt solvent and heating said mixture to melt the chloride salt solvent in which the magnesium oxide and aluminum oxide dissolve and react precipitating magnesium aluminate.

Ser. No. 11,100 filed Feb. 12, 1979 in the names of R. H. Arendt and M. J. Curran entitled "Magnesium Chrome Spinel" discloses a process which consists essentially of forming a mixture of magnesium oxide, chromium oxide and an alkali chloride salt solvent and heating said mixture to melt the chloride salt solvent in which the magnesium oxide and chromium oxide dissolve and react precipitating magnesium chromite.

Ser. No. 85,921 filed of even date herewith in the names of R. H. Arendt and J. H. Rosolowski entitled "Molten Salt Synthesis of Orthorhombic Lead Metaniobate Powder" discloses a process consisting essentially of forming a mixture of lead oxide, niobium pentoxide and an alkali chloride salt solvent and heating said mixture to melt the chloride salt solvent in which the lead oxide and niobium pentoxide dissolve and react precipitating orthorhombic lead metaniobate.

Ser. No. 85,911 filed of even date herewith in the names of R. H. Arendt and J. H. Rosolowski entitled "Molten Salt Synthesis of Alkali Niobate Powders" discloses a process consisting essentially of forming a mixture of niobium pentoxide, an oxide of an alkali selected from the group consisting of sodium, potassium, lithium and mixtures thereof, and an alkali chloride salt solvent, and heating said mixture to melt the chloride salt solvent in which the niobium oxide and alkali oxide dissolve and react precipitating the alkali niobate.

Ser. No. 85,924 filed of even date herewith in the name of R. H. Arendt entitled "Molten Salt Synthesis of Barium And/Or Strontium Titanate Powder" discloses a process consisting essentially of forming a particulate mixture of an alkali chloride solvent salt, titanium oxide and an alkaline earth reactant selected from the group consisting of barium oxide, strontium oxide, and mixtures thereof, and heating the mixture to melt the chloride salt solvent in which the titanium oxide and alkaline earth reactant dissolve and react precipitating a titanate selected from the group consisting of barium titanate, strontium titanate and mixtures thereof.

What is claimed is:

1. A process for producing a modified alkali niobate having the formula $(A_{2x}B_{1-x})Nb_2O_6$ wherein A is alkali atom selected from the group consisting of Na, K and mixtures thereof, B is cation selected from the group consisting of Pb, Cd and mixtures thereof, and x has a value ranging from an effective amount up to but less than 1, which consists essentially of providing in stoichiometric amount an alkali oxide selected from the group consisting of $Na_2O$, $K_2O$ and mixtures thereof or particulate precursor therefor, providing in stoichiometric amount cation oxide selected from the group consisting of PbO, CdO and mixtures thereof or particulate precursor therefor, providing in stoichiometric amount particulate $Nb_2O_5$ or particulate precursor therefor, providing an alkali chloride salt selected from the group consisting of sodium chloride, potassium chloride and mixtures thereof, forming a mixture of said alkali oxide or precursor therefor, said cation oxide or precursor therefor, said $Nb_2O_5$ or precursor therefor and said chloride salt solvent, said chloride salt being used in an amount of at least about 20% by weight of the total amount of said alkali oxide, cation oxide, $Nb_2O_5$ and chloride salt, heating said mixture to a reaction temperature at least sufficient to melt said chloride salt, each said precursor decomposing completely at or below said reaction temperature to form said oxide and by-product gas, said chloride salt in molten form being a solvent for said alkali oxide, cation oxide and $Nb_2O_5$, maintaining said reaction temperature dissolving and reacting said alkali oxide, cation oxide and $Nb_2O_5$ in said molten salt and precipitating said modified alkali niobate, and recovering said precipitated modified alkali niobate by dissolving said chloride salt and separating said precipitated modified alkali niobate from the resulting salt solution.

2. The process according to claim 1 wherein x has a minimum value of 0.001.

3. The process according to claim 1 wherein said alkali oxide is $Na_2O$.

4. The process according to claim 1 wherein said alkali oxide is $K_2O$.

5. The process according to claim 1 wherein said cation oxide is PbO.

6. The process according to claim 1 wherein said cation oxide is CdO.

7. The process according to claim 1 wherein said alkali oxide or precursor therefor, said cation oxide or precursor therefor, and said $Nb_2O_5$ or precursor therefor, range in particulate size from submicron up to about 100 microns.

8. The process according to claim 1 wherein said chloride salt is a mixture comprised of 50 mole % sodium chloride and 50 mole % potassium chloride and said reaction temperature is a minimum of about 658° C.

* * * * *